United States Patent
Kobayashi (10) Patent No.: US 8,001,517 B2
(45) Date of Patent: Aug. 16, 2011

(54) LAYOUT DESIGN METHOD OF SEMICONDUCTOR INTEGRATED CIRCUIT CELL TO ADJUST DISTANCES INSIDE CELL BETWEEN DIFFUSION LAYERS AND BORDERS OF CELL

(75) Inventor: Naohiro Kobayashi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/591,544

(22) Filed: Nov. 23, 2009

(65) Prior Publication Data

US 2010/0077371 A1    Mar. 25, 2010

Related U.S. Application Data

(62) Division of application No. 12/155,654, filed on Jun. 6, 2008, now abandoned.

(30) Foreign Application Priority Data

Jun. 13, 2007   (JP) ................................. 2007-156637

(51) Int. Cl.
    *G06F 17/50*    (2006.01)
(52) U.S. Cl. ........... 716/139; 716/119; 703/14; 257/204
(58) Field of Classification Search .................. 716/119, 716/139; 703/14; 257/204
    See application file for complete search history.

(56) References Cited

U.S. PATENT DOCUMENTS

| | | | | |
|---|---|---|---|---|
| 5,051,917 | A * | 9/1991 | Gould et al. | 716/17 |
| 5,291,043 | A * | 3/1994 | Arakawa | 257/208 |
| 5,612,893 | A * | 3/1997 | Hao et al. | 716/2 |
| 5,625,568 | A * | 4/1997 | Edwards et al. | 716/2 |
| 6,194,252 | B1 * | 2/2001 | Yamaguchi | 438/129 |
| 6,271,548 | B1 * | 8/2001 | Umemoto et al. | 257/202 |
| 6,385,761 | B1 * | 5/2002 | Breid | 716/8 |
| 6,418,551 | B1 * | 7/2002 | McKay et al. | 716/5 |
| 6,598,214 | B2 * | 7/2003 | Chatterjee et al. | 716/10 |
| 7,032,194 | B1 * | 4/2006 | Hsueh et al. | 716/4 |
| 7,093,215 | B2 | 8/2006 | Sahara et al. | |
| 7,200,825 | B2 * | 4/2007 | Watson et al. | 716/6 |
| 7,222,060 | B2 * | 5/2007 | Shimizu et al. | 703/14 |
| 7,290,234 | B2 * | 10/2007 | Shibayama | 716/11 |
| 7,320,116 | B2 * | 1/2008 | Mukaihira | 716/5 |
| 7,321,139 | B2 * | 1/2008 | Chang et al. | 257/202 |
| 7,484,198 | B2 * | 1/2009 | Lin et al. | 716/10 |

(Continued)

FOREIGN PATENT DOCUMENTS

JP    2004-241529    8/2004

(Continued)

OTHER PUBLICATIONS

U.S. Office Action dated Jul. 8, 2010 for U.S. Appl. No. 12/585,183.

(Continued)

*Primary Examiner* — Naum Levin (74) *Attorney, Agent, or Firm* — McGinn IP Law Group, PLLC (57) ABSTRACT

A semiconductor integrated circuit includes multiple cells each containing transistors. The transistors include a gate and diffusion layers. The multiple cells are adjacently formed in a first direction perpendicular to the gate. The distance between the cell border and the adjacent and corresponding diffusion layer, the first direction, is the same.

11 Claims, 8 Drawing Sheets

U.S. PATENT DOCUMENTS

| | | | |
|---|---|---|---|
| 7,600,207 B2 * | 10/2009 | Moroz et al. | 716/11 |
| 2003/0127697 A1 | 7/2003 | Ohta et al. | |
| 2004/0153986 A1 | 8/2004 | Sahara et al. | |
| 2006/0145266 A1 | 7/2006 | Zushi et al. | |
| 2006/0259881 A1 | 11/2006 | Sahara et al. | |
| 2007/0157144 A1 * | 7/2007 | Mai et al. | 716/10 |
| 2010/0001763 A1 * | 1/2010 | Kobayashi | 326/102 |

FOREIGN PATENT DOCUMENTS

| | | |
|---|---|---|
| JP | 2006-190727 | 7/2006 |

OTHER PUBLICATIONS

Office Action dated Mar. 21, 2011 for U.S. Appl. No. 12/585,183.

* cited by examiner

LAYOUT DESIGN METHOD OF SEMICONDUCTOR INTEGRATED CIRCUIT CELL TO ADJUST DISTANCES INSIDE CELL BETWEEN DIFFUSION LAYERS AND BORDERS OF CELL

The present Application is a Divisional Application of U.S. patent application Ser. No. 12/155,654, filed on Jun. 6, 2008 now abandoned.

This application is based on Japanese patent application No. 2007-156637, the content of which is incorporated hereinto by reference.

BACKGROUND OF THE INVENTION

1. Field of the Invention

This invention relates to a semiconductor integrated circuit, a layout design method of a semiconductor integrated circuit, and a layout program product of semiconductor integrated circuits.

2. Description of Related Art

Cell-based ICs (integrated circuits) are favorably used in LSI such as ASIC (Application Specific Integrated Circuits) as well as ASSP (Application Specific Standard Products) and microprocessors where high-integration and sophisticated functions are required. Cell-based ICs are designed by combining in-house circuits designed by the user while utilizing a library of cell circuits provided by the semiconductor manufacturer. The cell library includes cells of diverse types and sizes ranging from primitive cells mounted in basic circuits to macro cells containing macros for the CPU and memory, etc. Utilizing these cells reduces the design time and development costs since these cells can be placed and wired on the chip with "placement and routing tools" according to the user's design. Fabricating system LSI is also easy since macro cells containing a circuit layout such as a CPU can be incorporated unchanged onto the chip.

Figure 1:
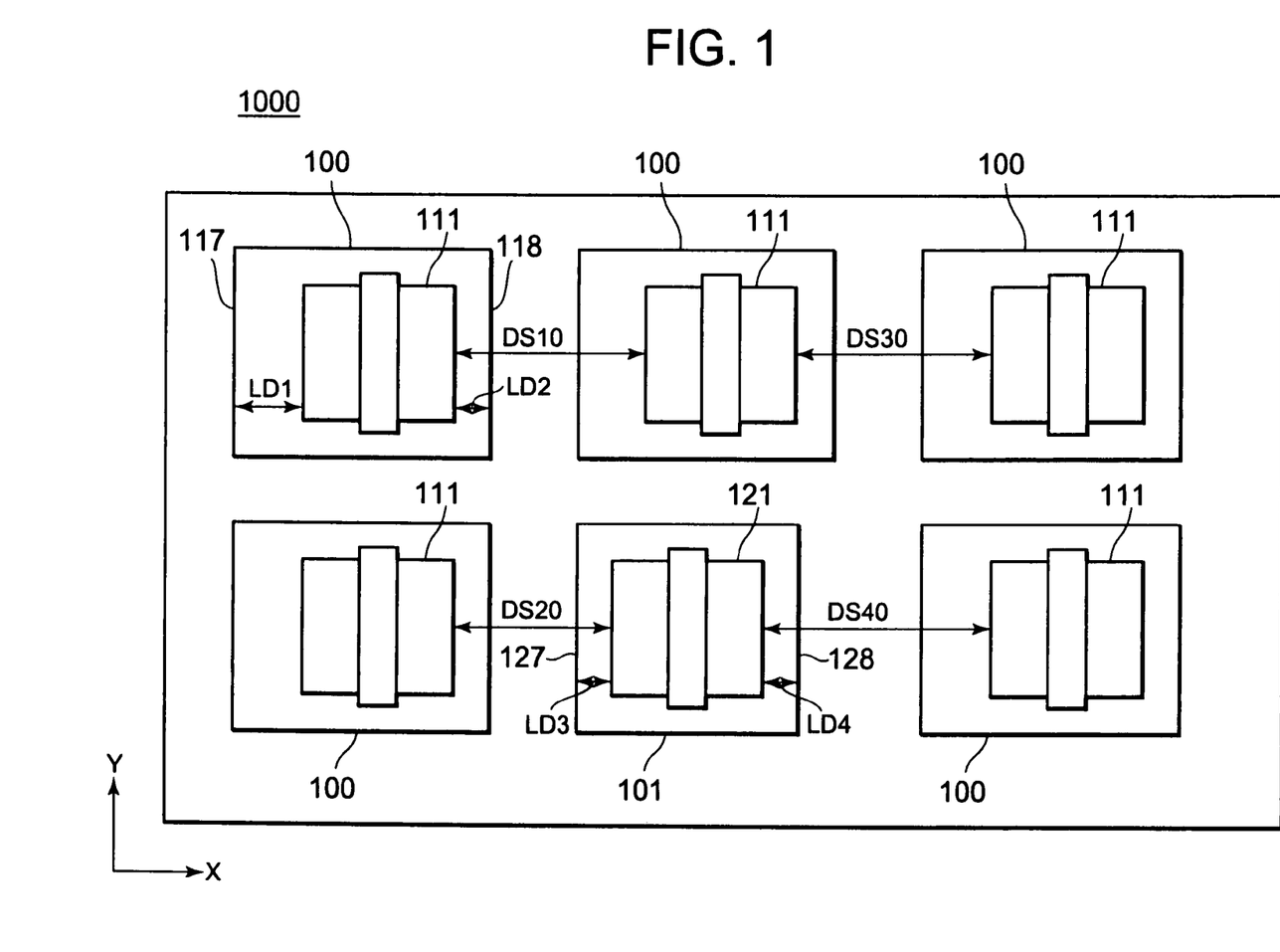
FIG. 1 is a plan view showing cells mounted on a semiconductor chip, and the diffusion layer gap between the cells in a related art.

FIG. 1 is a conceptual drawing showing the cell-based IC (Hereafter called chip 1000) of a related art. The chip 1000 contains multiple cells 100, 101. The cells 100, 101 each shall include a diffusion layer 111, 121 for forming MOS transistors. The cell 100 and the cell 101 shall have different circuit structures.

Usually, cells containing different circuits and devices are mounted on the chip. Thus, the layout of the diffusion layer shapes and positions is usually different in each cell. Moreover, the cell internal layout is designed while taking the wiring and installation surface area into account so the distances in the X direction between the diffusion layers in the cell and the cell boundary (Hereafter, called the cell border.) are usually not uniform. In the cell 100 shown in FIG. 1 for example, the distances LD1, LD2 between the diffusion layer 111 and the adjacent cell borders 117, 118 along the X distance and opposite the diffusion layer in the drawing are different values. In cell 101 on the other hand, the distances LD3, LD4 between the diffusion layer 121 and the adjacent cell borders 127, 128 opposite the diffusion layer along the X direction in the drawing are the same values. The longitudinal portion of the gate is set in the Y direction, and the direction perpendicular to that (direction) is set as the X direction.

Distances between the cell border and diffusion layer are also different in each cell due to differences in the layout of each cell. When the cells 100, 101 each possessing different cell structures are placed on the chip 1000 as shown in FIG. 1, then the diffusion layer distances (X direction) between cells are different values due to the type of adjacent cells in the X direction. The distance DS 10 between the diffusion layers 111 of the same type cells 100 for example, is a different value than the distance DS20 between diffusion layer 121 of cell 101 and diffusion layer 111 of cell 100. Moreover, the diffusion layer distance (X direction) between cells is also a different value according to the adjacent cell directions. For example, the distance DS20 to the diffusion layer of cell 100 adjacent to cell border 127 of cell 101, is a different value than the distance DS40 to the diffusion layer of cell 100 adjacent to the cell border 128 of cell 101.

Applying stress to the diffusion layer forming the MOS transistor from the device isolation region when the diffusion layers are isolated for example by STI (Shallow Trench Isolation) is known to change the drive characteristics of that MOS transistor. In the case of a cell 100 containing a diffusion layer 111 forming a MOS transistor, the distances LD1, LD2 between the cell border and diffusion layer 111 are different so that for example even if the adjacent cells are placed at equally spaced distances from each other, the stress acting on the diffusion layer 111 from the cell border side will cause different values on the left and right (along the X direction). The distances DS10-DS40 between the adjacent diffusion layers will therefore be different if multiple MOS transistors are arrayed along the X direction within the cell, so that a MOS transistor at a position that is a distance LD1 from the cell border, and a MOS transistor at a position that is a distance LD2 from the cell border will exhibit different drive characteristics due to the stress from the device isolation region.

Further, when cells 100, 101 are placed as shown in FIG. 1 in a line of mutually adjacent cells 100 in the X direction and a line of adjacent cells 100 and cells 101, the size of the stress acting from the periphery on the diffusion layers 111, 121 will be different values. Also, if there are different type cells within a line, then the diffusion layer distance between cells will not be uniform and the size of the stress applied to the diffusion layers within the cells will be different. Irregularities (variations) will occur within the characteristics of MOS transistors in the chip 1000 and cause the product characteristics to deteriorate.

Along with the greater miniaturization of semiconductor circuits in recent years, fluctuations in MOS transistor characteristics due to differences in stress such as described above are seen as a problem. Technology to equalize the stress applied to the diffusion layer is therefore greatly needed.

Conversely, the technology of the background art as for example in Japanese Laid Open patent Application Publication No. 2006-190727 discloses technology for obtaining the desired performance by making positive use of the stress from the device isolation region. Technology is also disclosed for example in Japanese Laid Open Patent Application Publication No. 2004-241529 for equalizing the stress applied by the channel region of the transistor along the channel width due to trench isolation.

However even applying these technologies to cell-based IC (CBIC) does not correct irregularities in the distance between diffusion layers among cells. The above later Patent document in particular, resolves the problem of stress along the channel width but cannot correct the stress along the channel length or in other words, the direction perpendicular to the gate. The technology of the background art was therefore incapable of preventing fluctuations in MOS transistor characteristics caused by variations in stress on the diffusion layer.

SUMMARY OF THE INVENTION

A semiconductor integrated circuit of an exemplary aspect of the present invention contains multiple types of cells including respectively different circuits. Each of these multiple types of cells includes a transistor containing a gate and a diffusion layer. In these multiple types of cells, the distances between diffusion layers among adjacent cells in a first direction perpendicular to the gate are substantially equal.

A layout design method of a semiconductor circuit device of an exemplary aspect of the present invention includes: setting a cell layout by unifying a first distance between a first boundary for cells in a first direction perpendicular to the gate, and a second boundary opposite the first boundary, and a second distance between the diffusion layer nearest a second boundary with a limit value; and generating library data serving as the input for a placement and routing tool based on the layout that was set; and recording the library data onto a storage device. Arraying the cells on the chip in this way allows forming uniform gaps between the diffusion layers among the cells.

A layout setup method of a semiconductor integrated circuit of an exemplary aspect of the present invention preferably further includes setting the cell layout by unifying the distance to the gate, and the boundary of the adjacent cells in a first direction perpendicular to the longitudinal direction of the gate relative to the gate within the cell; to a limit value. Arraying the cells on the chip in this way allows forming uniform gaps between the gates among the cells.

The semiconductor integrated circuit designed by the layout setup method of a semiconductor integrated circuit of an aspect of the present invention includes multiple cells containing transistors formed from gates and diffusion layers. Each of the multiple cells is adjacently formed in a first direction perpendicular to the gate. The distances between the nearest diffusion layers enclosed by adjacent cell boundaries are in this case equal for each of the multiple cells. The gaps between the diffusion layers among the cells are therefore uniform in the multiple cells. These multiple cells also include a first cell containing a first circuit, and a second cell containing a second circuit different from the first circuit.

In each of the multiple cells, a first distance between a first boundary of a cell in a first direction, and the diffusion layer nearest the first boundary, is preferably equal to a second distance between a second boundary facing the first boundary, and a diffusion layer nearest the second boundary.

Also in each of the multiple cells, a first distance between a first boundary for a cell in a first direction, and a gate nearest the first boundary, is preferably equal to a second distance between a second boundary opposite the first boundary, and a gate nearest a second boundary.

The semiconductor integrated circuit, the layout design method for semiconductor integrated circuits, and automatic layout program product for semiconductor integrated circuits of this invention are capable of preventing variations in transistor characteristics within the semiconductor integrated circuit.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

Exemplary modes or embodiments for implementing the semiconductor integrated circuit, layout design method for semiconductor integrated circuits, and automatic layout program product for semiconductor integrated circuits of this invention are described next while referring to the accompanying drawings. The present embodiment is described utilizing as an example, a semiconductor integrated circuit automatic layout device for designing LSI circuits.

Figure 2:
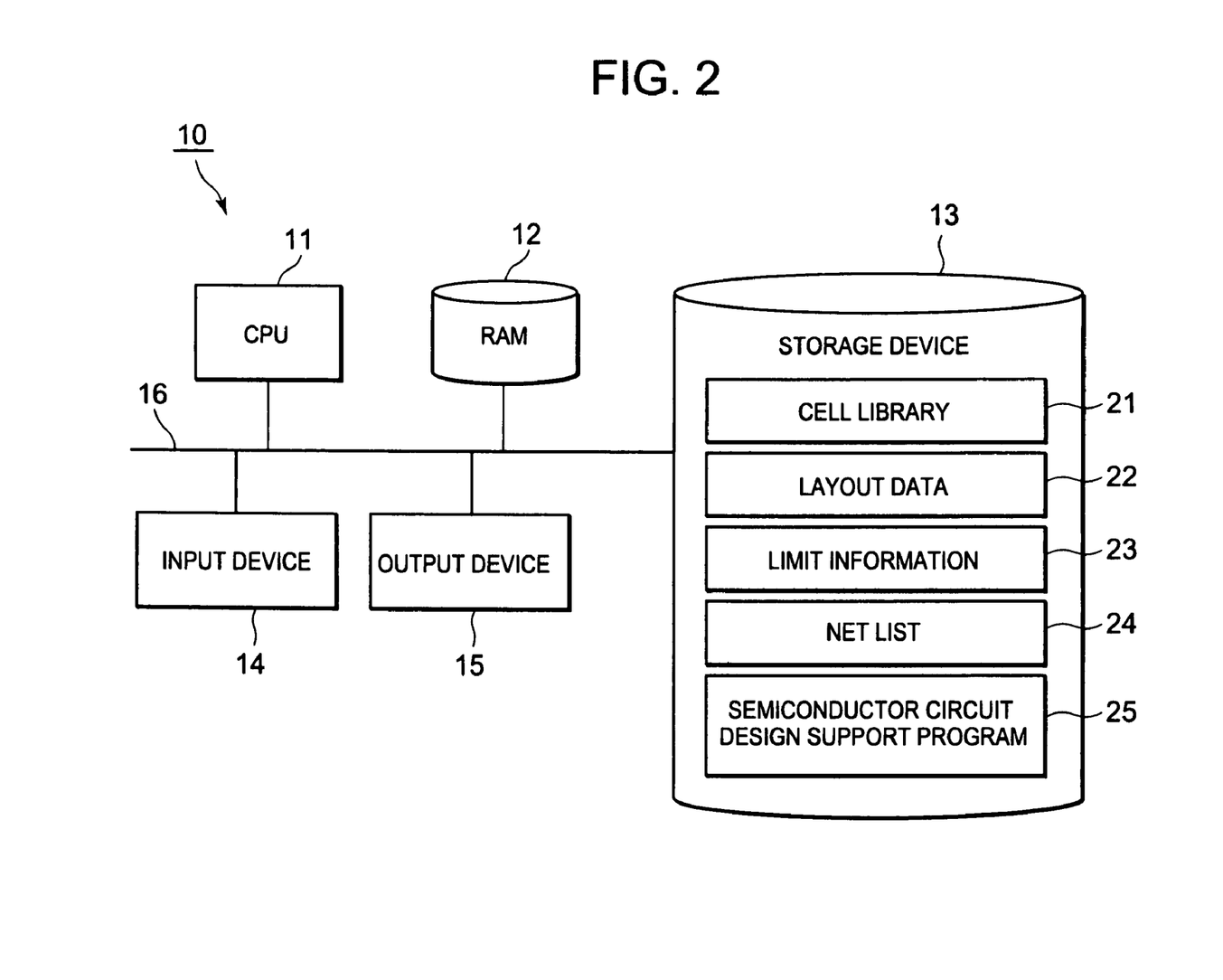
FIG. 2 is a block diagram showing an exemplary structure of an embodiment of the automatic layout device for a semiconductor integrated circuit of the present invention.
Figure 3:
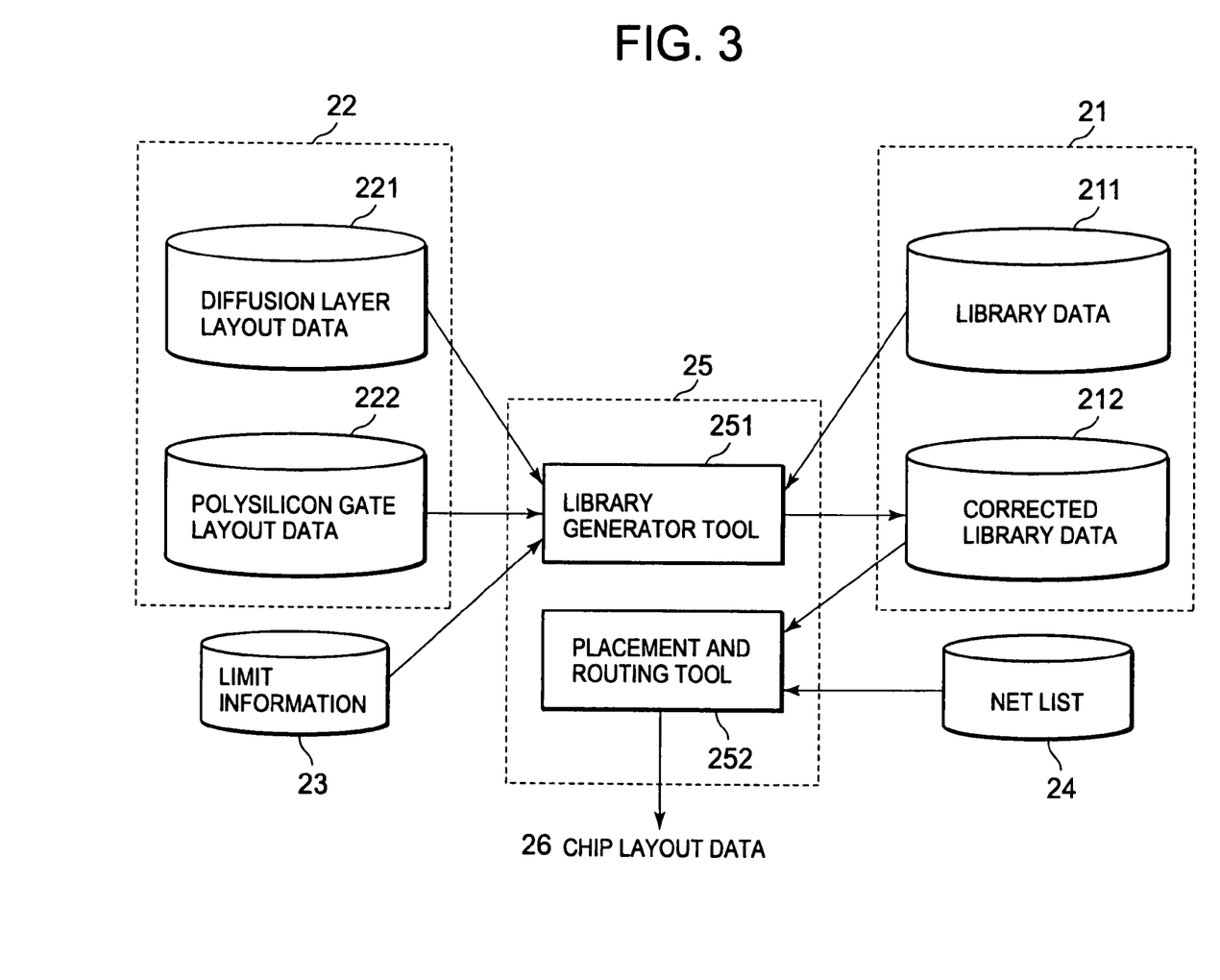
FIG. 3 is a block diagram showing exemplary structure and operation of an embodiment of a layout design method for a semiconductor integrated circuit of the present invention.

A structure of a semiconductor integrated circuit automatic layout device 10 of this invention is described while referring to FIG. 2 and FIG. 3. FIG. 2 is an exemplary block diagram of the semiconductor integrated circuit automatic layout device 10 of the present invention. Referring here to FIG. 2, the automatic layout device 10 contains an output device 15, an input device 14, a storage device 13, a RAM 12 and a CPU 11 mutually connected by way of a bus 16. The storage device 13 is an external storage device such as a hard disk or memory. The input device 14 is a mouse or a keyboard operated by the user and outputs different types of data to the CPU 11 and the storage device 13. The output device 15 is typically a monitor or printer, and outputs the layout results for the semiconductor integrated circuit output from the CPU 11 for visual recognition by the user.

The storage device 13 stores the automatic layout cell library 21, the layout data 22, the limit information 23, the net list 24, and the semiconductor integrated circuit automatic layout program 25. The CPU 11 executes the automatic layout program 25 for semiconductor integrated circuits within the storage device 13 in response to inputs from the input device 14, and performs conversion processing or generating of the cell library, and cell placement and route (or wiring) processing. The different types of data and programs from the storage device 13 are in this case temporarily stored in the RAM 12, and the CPU 11 executes the different types of processing by utilizing data within the RAM 12.

The interior of the automatic layout cell library 21 as shown in FIG. 3, is an aggregation of data (hereafter called "library data") relating to macro cells whose design layout was already completed. The automatic layout cell library 21 contains a registry of macro cells including basic circuits such as NAND and flip-flops, and to macro cells including large-scale circuits such as CPU cores and ROMs and RAMs. The automatic layout cell library 21 also contains library data 211 and corrected library data 212. This library data 211 and corrected library data 212 is LEF (Library Exchange Format) data utilized for cell placement and wiring (routing) onto the chip 1 and includes information relating to pin placement within the cell. The library data 211 is LEF data for cells whose layout is not defined in the limit information 23. The corrected library data 212 is LEF data for cells whose layout was corrected based on the limit information 23.

The layout data 22 is the diffusion layer layout data 221, polysilicon gate layout data 222, and GDS formatted data including the size and wiring and contact layout of boundaries (cell borders) not shown in the drawing. The diffusion layer layout data 221 is layout data including position coordinates for the diffusion layers layout within the cell. The polysilicon gate data 222 is layout data including position coordinates for polysilicon gates (gate wiring or gates) layout within the cell. The limit information 23 is condition information for specifying the size of the cell borders, and the distance between the diffusion layer and cell border, or the distance between the polysilicon gate and cell border when the corrected library data 212 is generated. The net list 24 is logic circuit design results showing contact information for the macrocell.

The semiconductor integrated circuit automatic layout program 25 executed by CPU 11 performs each function of the library generator tool 251 and placement and routing tool 252. The library generator tool 251 corrects the library data 211 by using the cell layout data 22 and the limit information 23, and generates the correction library data 212. The placement and routing tool 252 places and wires (or routes) the cells on the chip 1 using the net list 24 and correction library data 212. The placement and routing tool 252 in this case checks the size of the cell and the pin placement of the macrocell contained in the correction library data 212, and places and wires the cell while taking the wiring delay and design rules such as wiring width and cell gap into account.

Figure 4A:
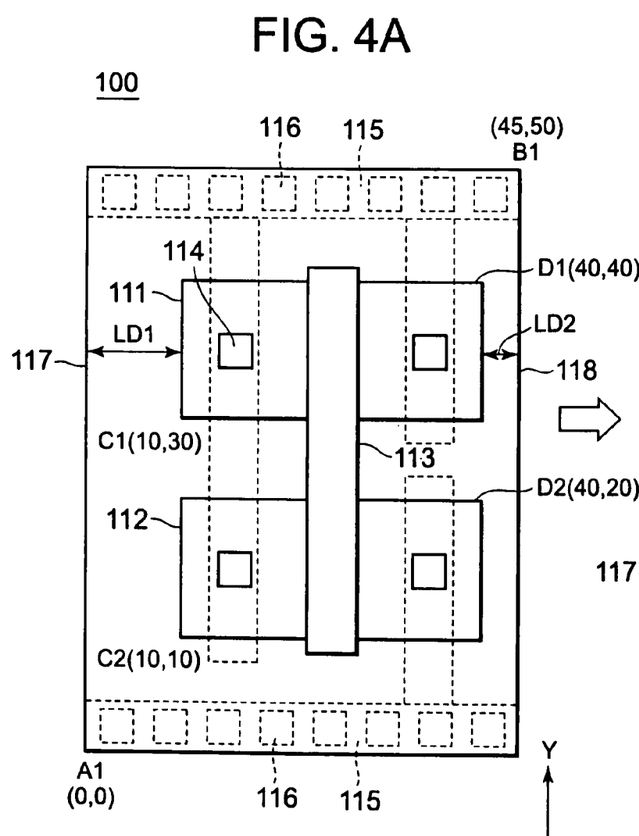
FIG. 4A is a plan view showing a layout before correcting the distance between the diffusion layer and cell border, in an inverter cell of the present invention.
Figure 4B:
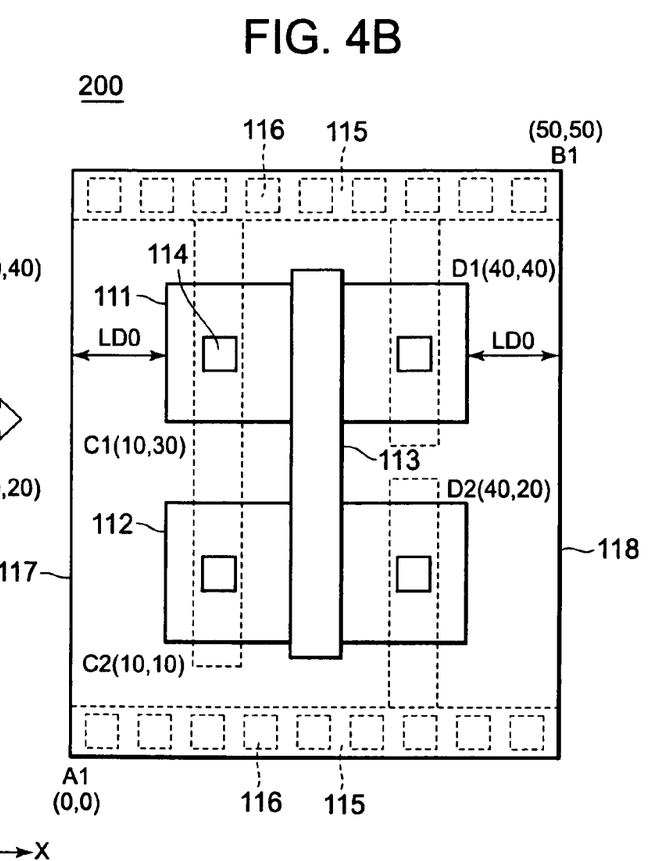
FIG. 4B is a plan view showing a layout after correcting the distance between the diffusion layer and cell border in the inverter cell of the present invention.

The automatic cell layout process executed by the semiconductor integrated circuit automatic layout device 10 of this invention is described next in detail while referring to FIG. 3 through FIG. 5. The semiconductor integrated circuit automatic layout device 10 of this invention performs the chip layout in two phases which are a process for generating the corrected library data 212 and a process for placing and wiring the cells. The process where the automatic layout device 10 lays out the multiple types of cells on the chip 1 in the placement and wiring process is described next using as an example the placing of cells holding containing inverters, and the placing of cells containing NAND circuits on the chip 1.

The library generator tool 251 searches the cell library, corrects the applicable library data 211 if the library for cells for placement in chip 1 only contains library data 211 prior to corrections, and generates the corrected data 212. In this case, the library generator tool 251 corrects the distance between the cell border and diffusion layer, or the distance between the polysilicon gate and the cell border within the applicable cell by utilizing the layout data 22 for the cell matching the library data 211, and generates the corrected library data 212. This corrected library data 212 may be generated after deciding the cell to mount in the product or may be generated in advance for all cells.

A process for generating corrected library data 212 for cells 100 containing an inverter are described next while referring to FIG. 4A and FIG. 4B. FIG. 4A shows a exemplary layout of a cell 100 (inverter) matching the library data 211. The cell 100 here is laid out as an inverter circuit connected by a contact 114 and a wire 115, and containing two MOS transistors formed by the diffusion layers 111, 112 and the polysilicon gate 113. The cell 100 layout matching the library data 211 is here set the same as in the background art without considering the distance between the cell borders 117, 118 and the diffusion layers 111, 112 nearest the cell border. Therefore, the distance LD1 between the nearest adjacent diffusion layer in the X direction on the drawing and the cell border 117, might sometimes show a value that is different from the distance LD2 between the nearest adjacent diffusion layer in the X direction on the drawing and the cell border 118 opposite the cell border 117. The gate direction is here set as the Y direction, and the perpendicular direction (to the Y direction) is set as the X direction.

The library generator tool 251 searches the diffusion layer layout data 221 for cell 100, detects relative positions for the diffusion layers 111, 112 and the cell borders 117, 118 and detects the nearest diffusion layers respectively for the cell borders 117, 118. More specifically, the library generator tool 251 checks the cell border coordinates A1 (0, 0), B1 (45, 50), the diffusion layer 111 coordinates C1 (10, 30), D1 (40, 40), the diffusion layer 112 coordinates C2 (10, 10), D2 (40, 20), and measures the distance between the diffusion layers 111, 112 and the cell borders 117, 118. In this embodiment, the diffusion layer 111 (112) with the shortest distance LD1 to the cell border 117, is detected as the diffusion layer nearest the cell border 117. The diffusion layer 111 (112) with the shortest distance LD2 to the cell border 118 is detected in the same way as the diffusion layer nearest the cell border 118. The library generator tool 251 at this time acquires the distance LD1 between the diffusion layer 111 and cell border 117 as "10", and the distance LD2 between the diffusion layer 111 and the cell border 118 as "5".

The library generator tool 251 changes the size of the cell borders of the cell 100 based on the limit information 23. Information defining the distance between the cell borders 117, 118 and the diffusion layer is set within the limit information 23 as the limit distance LD0. The limit distance LD0 may for example be a fixed value such as "10" or may be defined in a range such as "9 or more or 10 or less". When the distance between the cell borders 117, 118 and the diffusion layer is set within the limit information 23 as the limit distance LD0, for example, it is defined that the distance LD0 corrected from the distance LD1 is substantially the same as the distance LD0 corrected from the distance Ld2.

The library generator tool 251 unifies (substantially equalizes) the distance between cell borders 117, 118 and the diffusion layer 111 with the limit distance LD0 set in the limit information 23. FIG. 4B is a drawing showing an exemplary layout of the cell 200 where the distances LD1, LD2 are corrected to the limit distance LD0. If the limit distance LD0 for example is "10", then the library generator tool 251 sets the distance LD1 and changes the distance LD2 from "5" to "10". In this case, the library generator tool 251 changes the distance LD2 to the limit distance LD0 by changing the X coordinate of coordinate B1 of cell border 118 from "45" to "50". The position and the number of terminals 16 formed on the wire 115 are also changed along with the changes made in the cell border positions.

The library generator tool 251 extracts the wiring 115 and terminal 116 positions from the cell 200 layout information and generates corrected library data 212 serving as the input to the placement and routing tool 252.

The library generator tool 251 also unifies (substantially equalizes) the distance between the cell borders and the diffusion layers with the limit distance LD0 for other cells matching the library data 211, the same as above. The method for generating the corrected library data 212 for cells 101 containing other circuits (NAND) is described while referring to FIG. 5A and FIG. 5B.

Figure 5A:
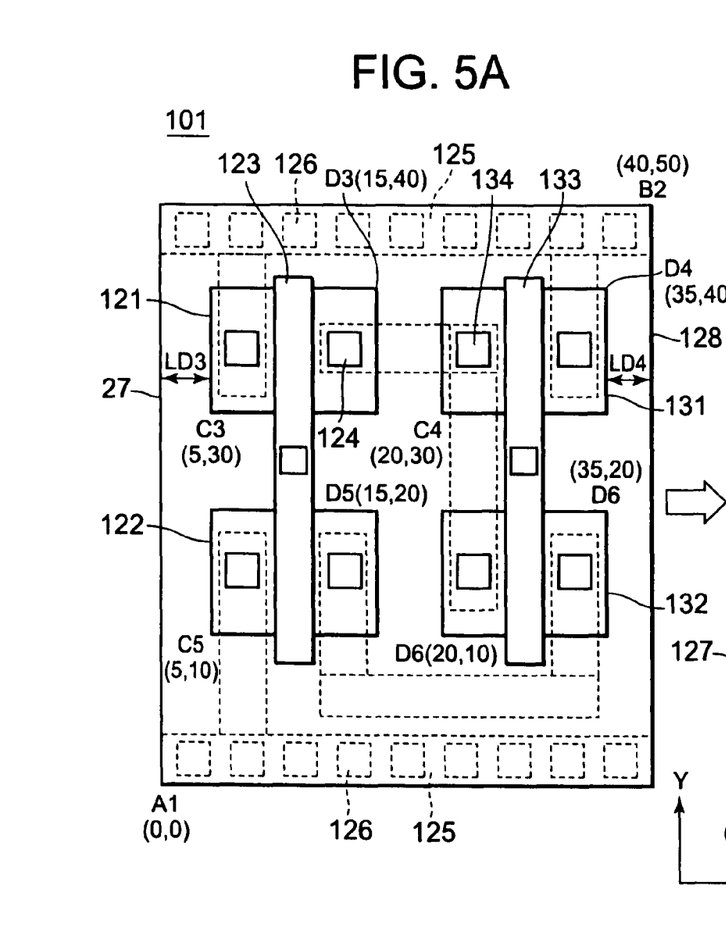
FIG. 5A is a plan view showing a layout before correcting the distance between the diffusion layer and cell border, in the NAND cell of the present invention.

FIG. 5A shows an exemplary layout of the cell 101 (NAND) matching the library data 211. The cell 101 is here laid out as a NAND circuit connected by the wire 125 and the contacts 124, 134, and including four MOS transistors formed from diffusion layers 121, 122 and the polysilicon gate 123, the diffusion layers 131, 132, and the polysilicon gate 133. The layout of the cell 101 matching the library data 211 is set without considering the distances between the cell borders 127, 128 and the diffusion layers 121, 122, the same as in the background art. Therefore, in cell 101 just the same as in cell 100, the distance LD3 between the cell border 127 and the adjacent diffusion layer in the X direction in the drawing, might sometimes be a different value than the distance LD4 between the cell border 128 opposite the cell border 117, and the adjacent diffusion layer in the X direction in the drawing.

The library generator tool 251 searches the diffusion layer layout data 221 for the cell 101, detects relative positions for the diffusion layers 121, 122, 131, 132 and the cell borders 127, 128 and detects the nearest diffusion layers respectively for the cell borders 127, 128. More specifically, the library generator tool 251 checks the cell border coordinates A1 (0, 0), B1 (40, 50), the diffusion layer 121 coordinates C3 (5, 30), D3 (15, 40), the diffusion layer 122 coordinates C4 (5, 10), D4 (15, 20), the diffusion layer 131 coordinates C5 (20, 30), D5 (35, 40), the diffusion layer 132 coordinates C6 (20, 10), D6 (35, 20), and measures the distance between the diffusion layers 121, 122, 131, 132 and the cell borders 127, 128. In this embodiment, the diffusion layer 121 (122) with the shortest distance LD3 to the cell border 127, is detected as the diffusion layer nearest the cell border 127. At the same time, the diffusion layer 131 (132) with the shortest distance LD4 to the cell border 128, is detected as the diffusion layer nearest the cell border 128. The library generator tool 251 at this time acquires the distance LD3 between the diffusion layer 121 and cell border 127 as "5", and the distance LD2 between the diffusion layer 111 and the cell border 128 as "5". In this case, the distances LD2 and LD3 are the same. However, the distance LD2 may be different from the distance LD3.

The library generator tool 251 changes the size of the cell borders of the cell 101 based on the limit information 23. The library generator tool 251 unifies the distance between the diffusion layers 121, 122 and cell border 127, and the distance between the diffusion layers 131, 132 and cell border 128, with the limit distance LD0 set in the limit information 23.

Figure 5B:
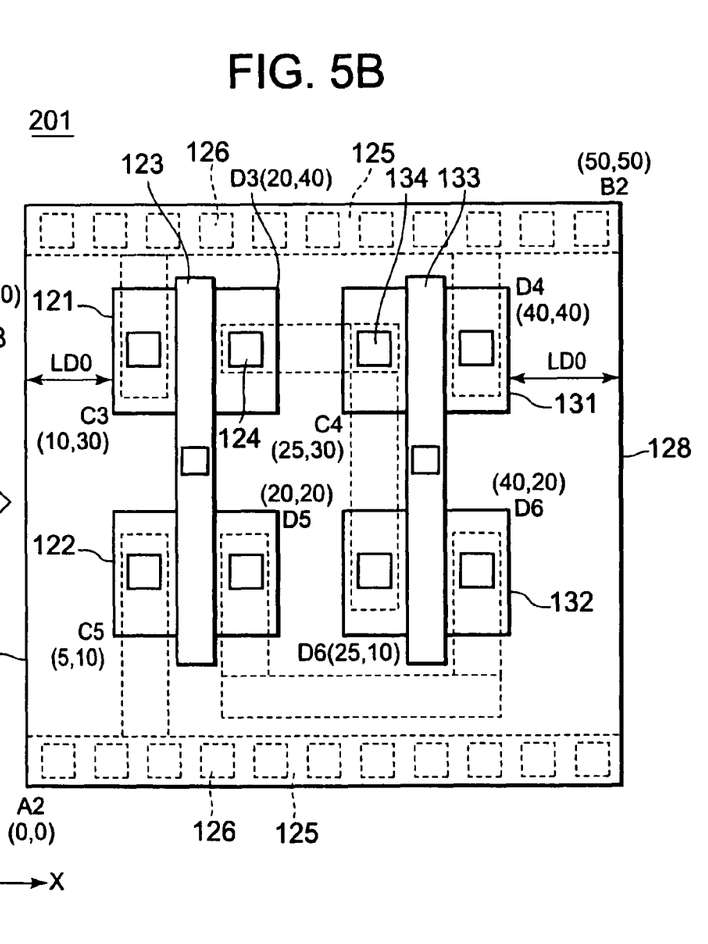
FIG. 5B is a plan view showing a layout after correcting the distance between the diffusion layer and cell border in the NAND cell of the present invention.

FIG. 5B is a drawing showing an exemplary layout of the cell 201 where the distances LD3, LD4 are corrected to the limit distance LD0. If the limit distance LD0 for example is "10", then the library generator tool 251 respectively changes the distances LD3 and LD4 and changes the distance LD2 from "5" to "10". In this case, the library generator tool 251 changes the distances LD3, LD4 to the limit distance LD0 by changing the respective X coordinates of the diffusion layer coordinates C3, C4, C5, C6, as well as the X coordinate of the coordinate B2 of cell border 128. The position and the number of terminals 126 formed on the wire 125 are also changed along with the changes made in the cell border positions. The distances LD, L4 may also be changed by changing the X coordinates of coordinates A2, B2 of the cell borders 127, 128 and changing the relative coordinates for the diffusion layer and cell border.

The library generator tool 251 extracts the wiring 125 and terminal 126 positions from the cell 201 layout information and generates corrected library data 212 serving as the input to the placement and routing tool 252.

The library generator tool 251 can in this way obtain a library of cells where the distance between the cell borders and diffusion layers are unified to the limit distance LD0. The placement and routing tool 252 then places and wires (or routes) the cell onto the chip 1 using the library (corrected library data 212) generated in this way.

Figure 6:
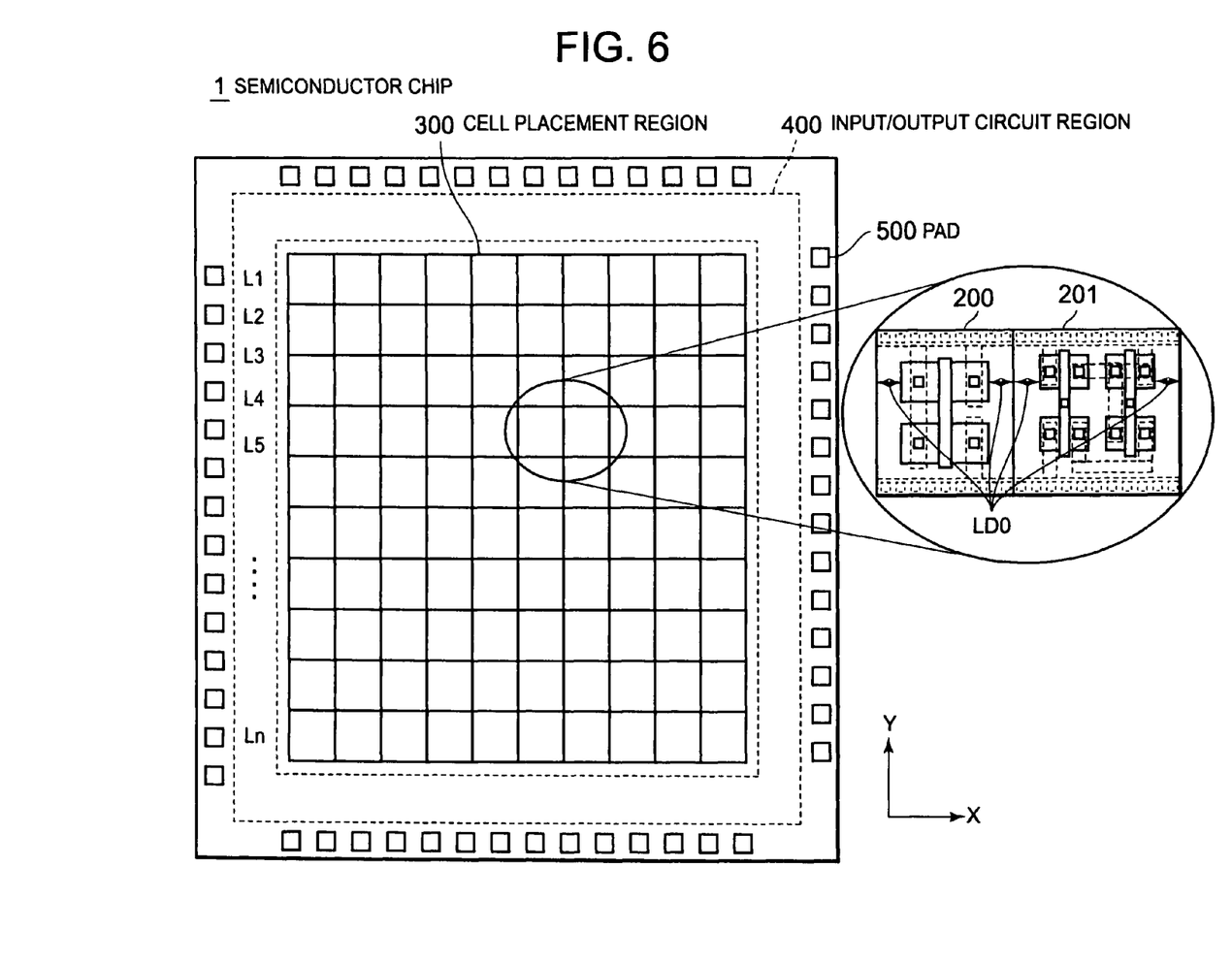
FIG. 6 is a plan view showing an exemplary structure of the semiconductor chip of the present invention.

FIG. 6 is a drawing showing an exemplary structure of the chip 1 where the cells were placed and wired by the placement and routing tool 252. In order to set the chip 1 layout by using the corrected library data 211, the placement and routing tool 252 places macrocells such as the cells 200 (inverters) and cells 201 (NAND) whose layouts were corrected, onto the cell placement region 300. The input/output circuit cells are placed on the input/output circuit region 400, the pad 500 mounted, and the layout of the chip 1 completed. This cell placement is performed in consideration of minimum overall wire length between cells and the wire delay time. Wiring between cells is carried out based on the net list 24. Results from the chip 1 layout are stored as chip layout data 26 in the storage device 13. The chip layout data 2 can be output visually from the output device 15, and the designer decides the chip 1 layout by referring to this data.

Figure 7:
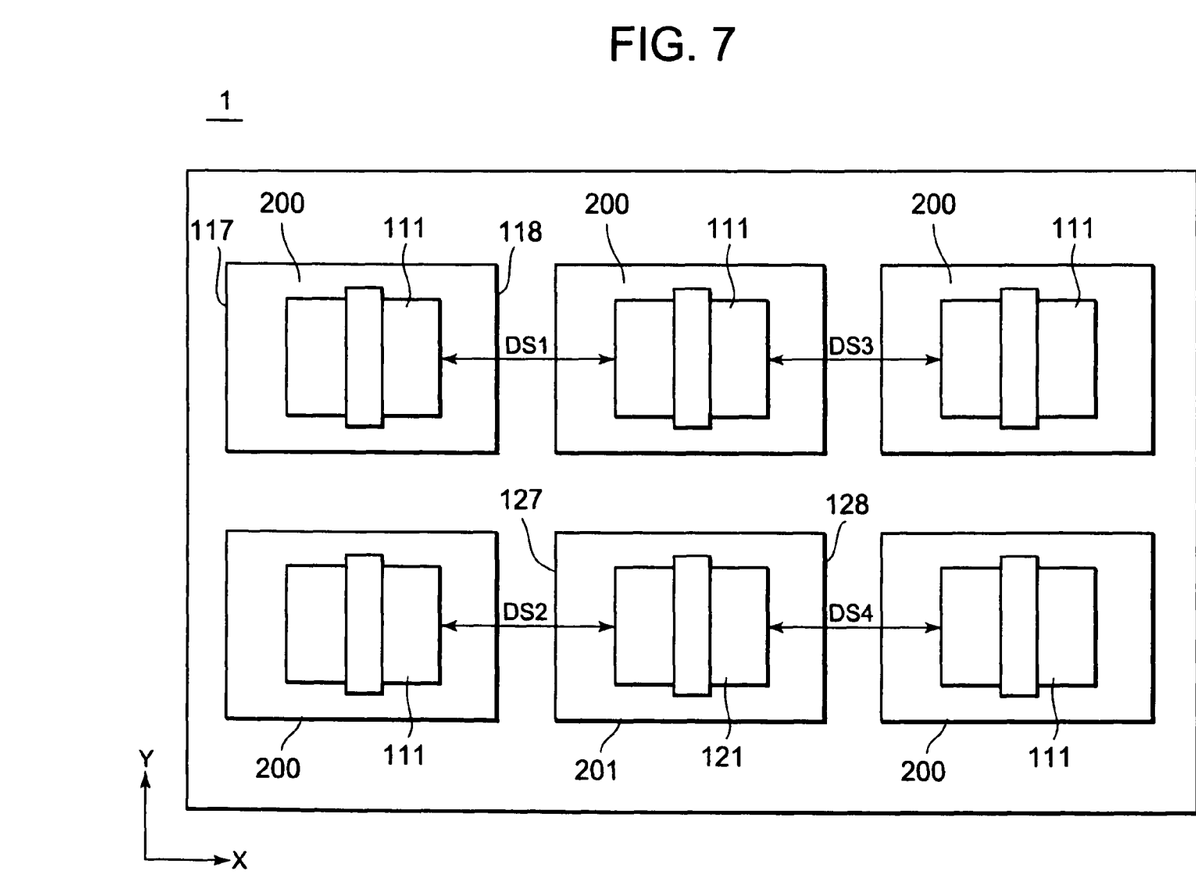
FIG. 7 is a plan view showing cells mounted on the semiconductor chip, and the diffusion layer gap between cells in the present invention.

The distances between the cell border and the diffusion layer adjacent to the cell border in the X direction are all unified to the limit distance LD0 for all cells mounted on the chip 1. Therefore, when placing cells on the chip 1, the diffusion layer gaps between adjacent cells in the X direction can be unified just by arraying them along the X direction, or at equidistant spaces. In other words, the distances to the nearest diffusion layer enclosed by adjacent cell boundaries on the chip will all be unified values. When placing cells 200, 201 of different cell structures on the chip 1 as seen in FIG. 7, the distances (X direction) to the diffusion layers among cells will be the same value (distance DS1=distance DS2) regardless of the adjacent cell type in the X direction. Moreover, the diffusion layer distance (X direction) among cells will also be the same value (distance DS1=distance DS3, distance DS2=distance DS4) in the adjacent cell directions. Further, variations in MOS transistor drive characteristics due to stress can equalized in all the cells.

The placement and routing tool 252 may also perform placement and wiring (or routing) by selectively using the library data 211 and the corrected library data 212 according to the product to be designed. In other words, cells where the distance between the cell borders and the diffusion layers was set to the limit distance LD0 may include either all or a portion of the cells in the placement region. However, in the case of a portion of the cells, then the cells where the distance between the cell border and diffusion layer is set to the limit distance LD0, are preferably any of the lines L1 to Ln in the X direction or placed over the entire region. By unifying the distance between the cell border and diffusion layer on each line in the X direction, variations in transistor characteristics can be reduced at least within the line.

In the above embodiment, the corrected library data 212 is formed by changing the distance between the cell border and diffusion layer. However the corrected library data 212 may also be formed by changing the distance between the cell borders and the polysilicon gates adjacent to the cell borders in the X direction, to the limit distance LD0'.

Figure 8A:
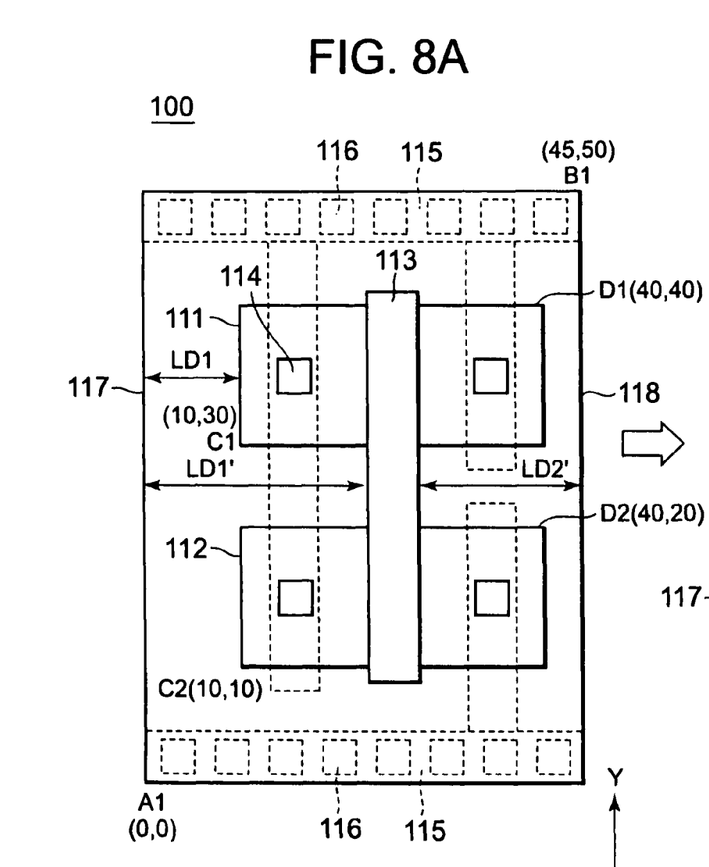
FIG. 8A is a plan view showing a layout before correcting the distance between the polysilicon gate and the cell border in the inverter cell of the present invention.
Figure 8B:
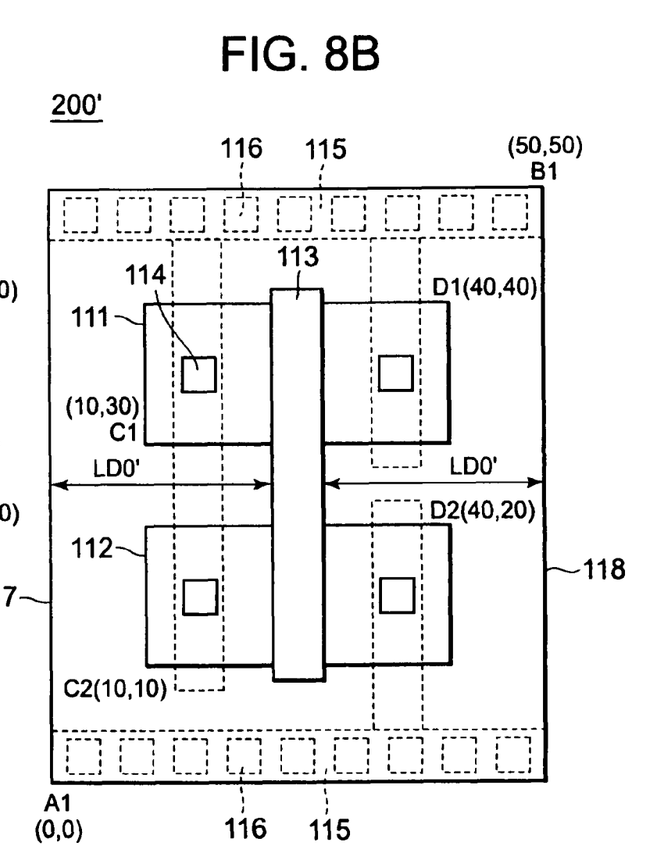
FIG. 8B is a plan view showing a layout after correcting the distance between the polysilicon gate and the cell border in the inverter cell of the present invention.

FIG. 8A and FIG. 8B are plan views showing an exemplary layout of cell 100 before correcting the distance between the polysilicon gate and cell border, and of the cell 200' after correction. The library generator tool 251 extracts the polysilicon gate layout data 222 from the layout data 22 for the cell 100 matching the library data 211, and identifies the relative positions of the cell frame and the polysilicon gate 113 by searching it (library data). The library generator tool 251 unifies the distances LD1', LD2' between the cell borders 117, 118 and the polysilicon gate 113 nearest the cell borders 117, 118 to the limit distance LD0' containing the limit information 23 the same as described above. The cell in FIG. 6 contains only one polysilicon gate but in the case of multiple polysilicon gates, the respective distances LD1', LD2' between the cell borders 117, 118 and the polysilicon gates adjacent to the cell borders 117, 118 are corrected for all of the multiple polysilicon gates. The library generator tool 251 generates corrected library data 212 including the size of the cell border and the position of terminal 116 of the layout-corrected cell 200'.

A cell with unified distances between the polysilicon gate and cell borders can in this way be formed on the chip by making uniform gaps between the polysilicon gates among the cells. On the other hand, when the gap between polysilicon gates among the cells is not uniform, then the gate patterns in each cell will be non-uniform in the lithography process and variations will occur in the drive characteristics. In this invention, the gaps between the polysilicon gates among cells are uniform so that variations in the gate pattern (especially in the gate width) in each cell can be prevented. Variations in transistor characteristics in each line or in the entire semiconductor chip 1 can therefore be prevented.

The library data generator unit 251 selects whether to set the distance between the diffusion layer and cell border to the limit distance LD0, or to set the distance between the gate and cell border to the limit distance LD0' according to the semiconductor chip 1 to be manufactured, and generates the corrected library data 212. The library data generator unit 251 may also generate the corrected library data 212 where the distance between the cell borders and both the diffusion layer and the gate were unified to a limit value.

The exemplary embodiments of this invention were described above. However, the specific structure is not limited by the above embodiments, and the present invention may include changes within a range not departing from the spirit and scope of this invention. The library generator tool 251 of the embodiments corrects the cell library (library data 211) by using the input from the place and route (wiring) tool of the background art, and generates the corrected library data 212. However, the invention is not limited to this (method). The library generator tool 251 may directly generate library data serving as the input for the place and route (wiring) tool, based on a cell layout where the distances between the cell and diffusion layer or the cell and gate were unified, and without using the library data 211. Moreover, the embodiment also described an example where an inverter cell and a NAND cell were mounted on the semiconductor chip. However, the invention is not limited to this example, and a macro cell containing other circuits may also be mounted. The layout on the semiconductor chip 1 may be set by generating the corrected library data 212 the same as described above.

Further, it is noted that Applicant's intent is to encompass equivalents of all claim elements, even if amended later during prosecution.

The invention claimed is:

1. A layout design method of a semiconductor integrated circuit, said method comprising:

providing a cell layout including a cell having a gate extending in a first direction and first and second diffusion layers so that said gate is arranged between said first and second diffusion layers, said cell having a first distance between a first boundary of said cell and said first diffusion layer in a second direction perpendicular to the first direction, and a second distance between a second boundary of said cell and said second diffusion layer;

regenerating the cell layout to set said first and second distances to a predetermined value;

generating a library data of said cell for a placement and routing tool, based on said regenerated cell layout; and recording the library data onto a storage device.

2. The layout design method according to claim 1, further comprising:

setting a layout of a semiconductor chip by arranging the cell in said second direction, using said library data; and displaying the layout of said semiconductor chip on a display.

3. The layout design method according to claim 1, wherein the providing the cell layout further comprises:

extracting a layout data of diffusion layers corresponding to said first and second diffusion layers from a layout data for a cell having already being designed; and changing said layout data of diffusion layers to set said first and second distances to said predetermined value.

4. The layout design method according to claim 1, further comprising:

setting the cell layout by substantially equalizing a distance between a gate and an adjacent cell boundary in said second direction, to said predetermined value.

5. A non-transitory computer-readable storage medium encoded with a computer program for a semiconductor integrated circuit according to claim 1 for executing the layout design method for semiconductor integrated circuits on a computer.

6. The layout design method according to claim 1, wherein said first distance and said second distance are equal.

7. The layout design method according to claim 1, wherein said cell layout further comprises:

a plurality of first cells each including said cell and comprising a first circuit; and a plurality of second cells each including said cell and comprising a second circuit different from said first circuit.

8. The layout design method according to claim 7, wherein said regenerating the cell layout further comprises:

setting a distance between adjacent diffusion layers of the first cells and the second cells in the second direction equal to a distance between adjacent diffusion layers of the first cells in said second direction.

9. The layout design method according to claim 7, wherein said regenerating the cell layout further comprises:

setting a distance from an edge of a diffusion layer to an edge of a corresponding and adjacent cell border in a cell of the first and second cells in said second direction equal to a distance from an edge of a diffusion layer to an edge of a corresponding and adjacent cell border in another cell of the first and second cells in said second direction.

10. The layout design method according to claim 7, wherein said regenerating the cell layout further comprises:

setting a distance from a gate to an edge of a corresponding and adjacent cell border in a cell of the first and second cells in said second direction equal to a distance from a gate to an edge of a corresponding and adjacent cell border in each other cells of the first and second cells in said second direction.

11. The layout design method according to claim 7, wherein said regenerating the cell layout further comprises:

setting respective distances between adjacent cell borders of the first and second cells in said second direction equal to each other.

* * * * *